United States Patent
Kim

(10) Patent No.: US 11,864,431 B2
(45) Date of Patent: Jan. 2, 2024

(54) LIGHT EMITTING DISPLAY DEVICE

(71) Applicant: LG Display Co., Ltd., Seoul (KR)

(72) Inventor: Mi-Ae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 168 days.

(21) Appl. No.: 17/123,489

(22) Filed: Dec. 16, 2020

(65) Prior Publication Data

US 2021/0202645 A1 Jul. 1, 2021

(30) Foreign Application Priority Data

Dec. 27, 2019 (KR) .................. 10-2019-0176489

(51) Int. Cl.
*H01L 27/12* (2006.01)
*H10K 59/126* (2023.01)
*H10K 59/88* (2023.01)
*H10K 59/122* (2023.01)

(52) U.S. Cl.
CPC ......... *H10K 59/126* (2023.02); *H10K 59/122* (2023.02); *H10K 59/88* (2023.02)

(58) Field of Classification Search
CPC .................. H01L 27/3272; H01L 27/3246
See application file for complete search history.

(56) References Cited

U.S. PATENT DOCUMENTS

| | | | |
|---|---|---|---|
| 8,330,675 B2 | 12/2012 | Choi | |
| 9,299,761 B2 | 3/2016 | Seo et al. | |
| 9,601,556 B2 | 3/2017 | Seo et al. | |
| 2003/0234971 A1* | 12/2003 | Murade | G02F 1/136209 257/E27.111 |
| 2010/0231126 A1 | 9/2010 | Choi et al. | |
| 2015/0187860 A1 | 7/2015 | Seo et al. | |
| 2016/0181344 A1 | 6/2016 | Seo et al. | |
| 2018/0033849 A1* | 2/2018 | Noh | H01L 27/1222 |
| 2021/0066421 A1* | 3/2021 | Son | H10K 59/1201 |

FOREIGN PATENT DOCUMENTS

| | | |
|---|---|---|
| KR | 10-2010-0103093 A | 9/2010 |
| KR | 10-2015-0080355 A | 7/2015 |
| KR | 10-2018-0077954 A | 7/2018 |

* cited by examiner

*Primary Examiner* — Vu A Vu
*Assistant Examiner* — Valerie N Newton
(74) *Attorney, Agent, or Firm* — Fenwick & West LLP

(57) ABSTRACT

A light emitting display device includes a lower substrate, a driving transistor positioned on the lower substrate and including a semiconductor layer, a gate electrode, a source electrode, and a drain electrode, and a light shield layer covering a lower surface, an upper surface, and a side surface of the semiconductor layer, for protecting the driving transistor from external light.

6 Claims, 13 Drawing Sheets

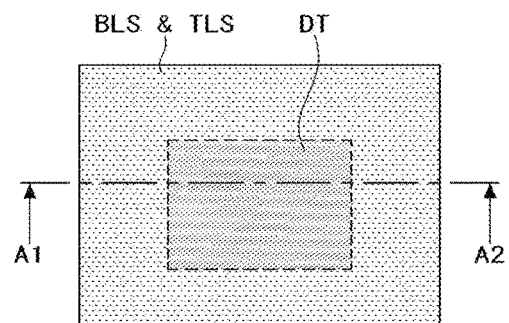
FIG. 7A
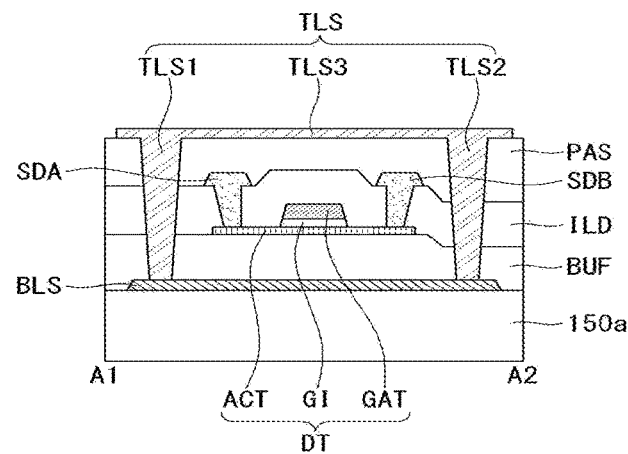
FIG. 7B
FIG. 8
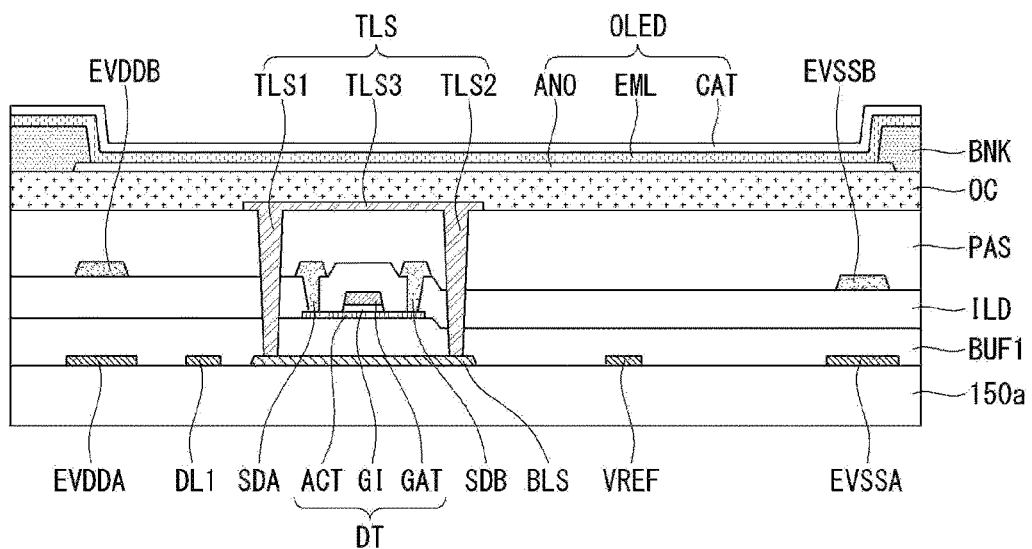

FIG. 18A                    FIG. 18B

LIGHT EMITTING DISPLAY DEVICE

CROSS-REFERENCE TO RELATED APPLICATION

This application claims the benefit of Republic of Korea Patent Application No. 10-2019-0176489, filed on Dec. 27, 2019, which is hereby incorporated by reference in its entirety.

BACKGROUND

Field of Technology

The present disclosure relates to a light emitting display device.

Discussion of the Related Art

With the development of information technologies, markets of display devices that are connection media between a user and information have expanded. Thus, display devices such as an organic light emitting display (OLED), a quantum dot display (QDD), and liquid crystal display (LCD) have been increasingly used.

The OLED or the like includes a display panel including a plurality of sub-pixels arranged in a matrix form, a driver for outputting a driving signal for driving the display panel, and a power supply for generating power to be supplied to the display panel or the driver. The driver includes a scan driver for supplying a scan signal (or a gate signal) to the display panel, and a data driver for supplying a data signal to the display panel. The aforementioned display device displays an image by enabling a selected sub-pixel to transmit light therethrough or to directly emit light when a driving signal, e.g., a scan signal and a data signal is supplied to sub-pixels formed on a display panel.

Some of the aforementioned display devices, for example, the OLED has the excellent response speed, viewing angle, and contrast ratio, and is easily thinned. The OLED includes a display panel configured to have a separate transparent area as well as a light emissive area, and thus, has been studied as a next-generation display device in various fields.

SUMMARY

The present disclosure provides a light emitting display device including a lower substrate, a driving transistor positioned on the lower substrate and including a semiconductor layer, a gate electrode, a source electrode, and a drain electrode, and a light shield layer covering a lower surface, an upper surface, and a side surface of the semiconductor layer, for protecting the driving transistor from external light.

In another aspect, the present disclosure provides a light emitting display device including a light shield layer covering a lower surface, an upper surface, and a side surface of the semiconductor layer, for protecting a semiconductor layer included in a sub-pixel from external light.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 7A and 7B are diagrams for explaining a light shield layer of a driving transistor shown in FIG. 6 according to the first embodiment of the present disclosure;

FIG. 8 is a diagram showing a first example of a sub-pixel according to a second embodiment of the present disclosure;

FIGS. 18A and 18B are diagrams for explaining advantages according to the fourth or fifth embodiment of the present disclosure.

DETAILED DESCRIPTION

Reference will now be made in detail embodiments of the invention examples of which are illustrated in the accompanying drawings.

With the development of information technologies, markets of display devices that are connection media between a user and information have expanded. Thus, display devices such as an organic light emitting display (OLED), a quantum dot display (QDD), and liquid crystal display (LCD) have been increasingly used.

Hereinafter, an OLED including an organic light emitting diode will be described with regard to exemplary embodiments of the present disclosure, but the present disclosure may also be applied to other display devices including an inorganic light emitting display.

Figure 1:
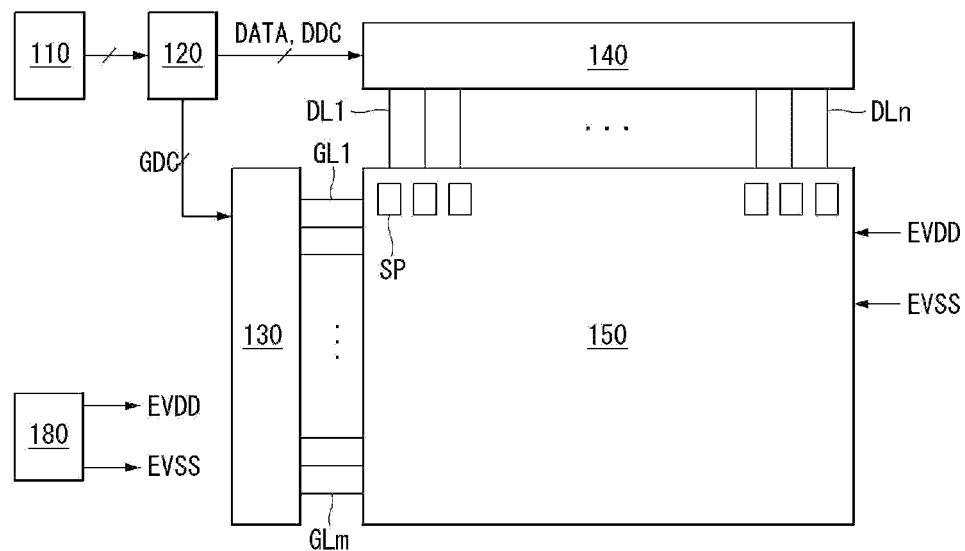
FIG. 1 is a schematic block diagram of an organic light emitting display (OLED) according to a first embodiment of the present disclosure.
Figure 2:
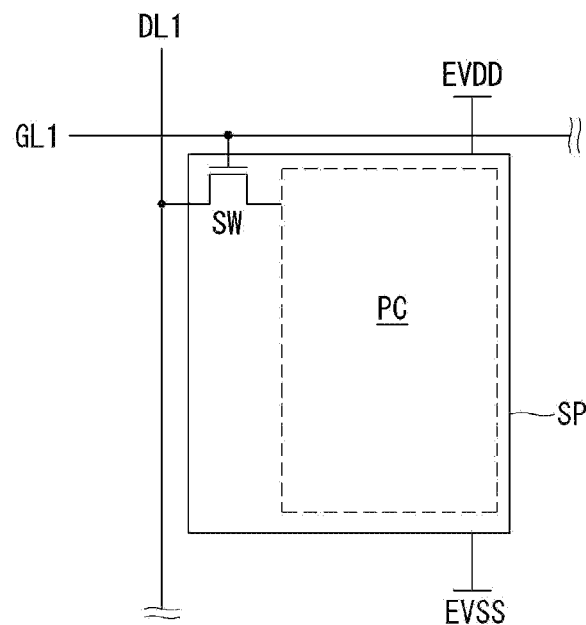
FIG. 2 is a schematic diagram showing a configuration of a sub-pixel shown in FIG. 1 according to the first embodiment of the present disclosure.
Figure 3:
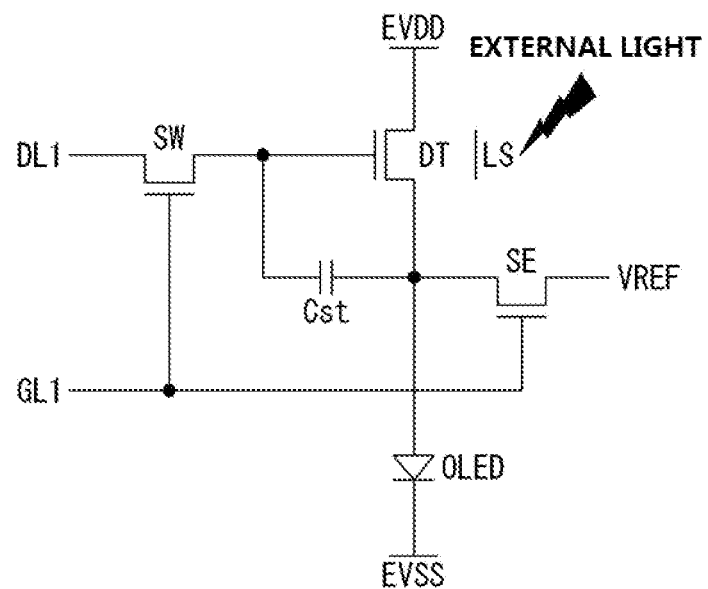
FIG. 3 is a diagram showing an example of a configuration of a detailed circuit of the sub-pixel according to the first embodiment of the present disclosure.

FIG. 1 is a schematic block diagram of an organic light emitting display (OLED) according to a first embodiment of the present disclosure, FIG. 2 is a schematic diagram showing a configuration of a sub-pixel shown in FIG. 1, and FIG. 3 is a diagram showing an example of a configuration of a detailed circuit of the sub-pixel according to the first embodiment of the present disclosure.

As shown in FIG. 1, the OLED may include an image supply 110, a timing controller 120, a scan driver 130, a data driver 140, a display panel 150, and a power supply 180.

The image supply 110 may output various driving signals with an image data signal supplied from the outside or an image data signal stored in an internal memory. The image supply 110 may supply a data signal and various driving signals to the timing controller 120.

The timing controller 120 may output a gate timing control signal GDC for controlling operation timing of the scan driver 130, a data timing control signal DDC for controlling operation timing of the data driver 140, and various synchronization signals (vertical synchronization signal Vsync and horizontal synchronization signal Hsync). The timing controller 120 may supply the data signal DATA supplied from the image supply 110 with the data timing control signal DDC to the data driver 140.

The scan driver 130 may output the scan signal (or a gate signal) in response to the gate timing control signal GDC or the like, which is supplied from the timing controller 120. The scan driver 130 may supply the scan signal to sub-pixels included in the display panel 150 through gate lines GL1 to GLm. The scan driver 130 may be formed in the form of an integrated circuit (IC) or may be directly formed on the display panel 150 in a gate in panel method.

The data driver 140 may sample and latch a data signal DATA in response to the data timing control signal DDC or the like supplied from the timing controller 120, may convert the data signal DATA into a data voltage in the form of an analog signal corresponding to a gamma reference voltage, and may output the data voltage. The data driver 140 may supply a data voltage to sub-pixels included in the display panel 150 through data lines DL1 to DLn. The data driver 140 may be formed in the formed of an integrated circuit (IC) and may be installed on the display panel 150 or may be installed on a printed circuit board, but the present disclosure is not limited thereto.

The power supply 180 may generate and output a high potential voltage EVDD and a low potential voltage EVSS based on an external input voltage supplied from the outside. The power supply 180 may generate and output a voltage (e.g., a scan high voltage or a scan low voltage) required to drive the scan driver 130 or a voltage (a drain voltage or a half drain voltage) required to drive the data driver 140 as well as the high and low potential voltages EVDD and EVSS.

The display panel 150 may display an image in response to a scan signal output from the driver including the scan driver 130 and the data driver 140, the driving signal including the data voltage, and the high and low potential voltages EVDD and EVSS output from the power supply 180. The sub-pixels of the display panel 150 may directly emit light.

As shown in FIG. 2, one sub-pixel SP may be defined by a first data line DL1, a first scan line GL1, the first voltage line EVDD, and the second voltage line EVSS. In addition, one sub-pixel SP may include a switching transistor SW, and a pixel circuit PC including a driving transistor, a storage capacitor, an organic light emitting diode, or the like.

The sub-pixel SP used in the OLED may directly emit light and may have a complicated circuit configuration compared with a liquid crystal display. In addition, a compensation circuit for compensating for degradation of a driving transistor for supplying driving current to an organic light emitting diode as well as the organic light emitting diode for emitting light may be complicated and diversified. Thus, it may be noted that the pixel circuit PC included in the sub-pixel SP is illustrated in the form of a block. However, according to the present disclosure, the sub-pixel SP may be embodied based on at least the configuration shown in FIG. 3.

As shown in FIG. 3, one sub-pixel SP according to the first embodiment of the present disclosure may include the switching transistor SW, a driving transistor DT, a sensing transistor SE, a storage capacitor CST, and an organic light emitting diode OLED.

The switching transistor SW may have a gate electrode connected to the first scan line GL1, a first electrode connected to the first data line DL1, and a second electrode connected to a gate electrode of the driving transistor DT and one end of the storage capacitor CST. The switching transistor SW may apply a data voltage transferred through the first data line DL1 to one end of the storage capacitor CST.

The driving transistor DT may have the gate electrode connected to the second electrode of the switching transistor SW and one end of the storage capacitor CST, a first electrode connected to the first voltage line EVDD, and a second electrode connected to the other end of the storage capacitor CST and an anode of the organic light emitting diode OLED. The driving transistor DT may generate driving current based on a data voltage stored in the storage capacitor CST. The driving transistor DT may have a light shield layer LS for shielding influence of external light. The driving transistor DT may have variability due to light with a blue wavelength (or light with high energy). Thus, the light shield layer LS may block external light such as a light with a blue wavelength and may protect the driving transistor DT.

The sensing transistor SE may have a gate electrode connected to the first scan line GL1, a first electrode connected to the second electrode of the driving transistor DT and an anode of the organic light emitting diode OLED, and a second electrode connected to a reference line VREF. The sensing transistor SE may sense the characteristics (threshold voltage or current mobility) of the driving transistor DT or the characteristics (threshold voltage) of the organic light emitting diode OLED and may then transfer the sensed characteristics to an external circuit.

The storage capacitor CST may have one end connected to the second electrode of the switching transistor SW and the gate electrode of the driving transistor DT, and the other end connected to the second electrode of the driving transistor DT, the first electrode of the sensing transistor SE, and the anode of the organic light emitting diode OLED. The storage capacitor CST may store a data voltage and may transfer the data voltage to the gate electrode of the driving transistor DT.

The organic light emitting diode OLED may have the anode connected to the second electrode of the driving transistor DT, the first electrode of the sensing transistor SE, and the other end of the storage capacitor CST, and a cathode connected to the second voltage line EVS S. The organic light emitting diode OLED may emit light in response to the driving current generated by the driving transistor DT. Hereinafter, an example in which a display panel is embodied based on the sub-pixel shown in FIG. 3 will be described with regard to the present disclosure.

Figure 4:
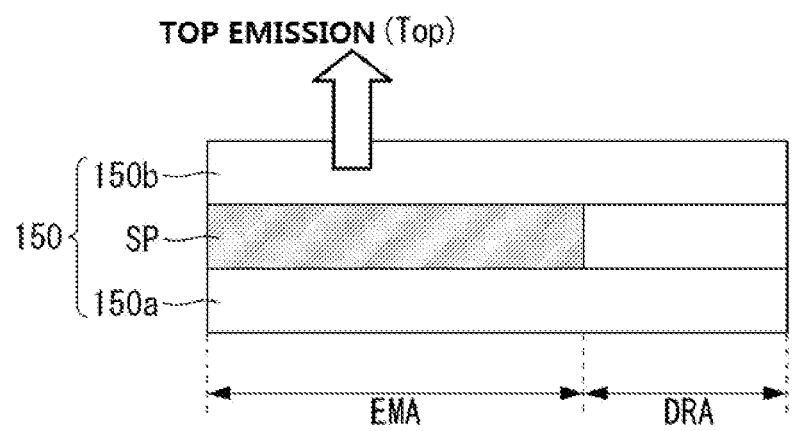
FIGS. 4 and 5 are cross-sectional views for explaining a function of a display panel according to the first embodiment of the present disclosure.
Figure 5:
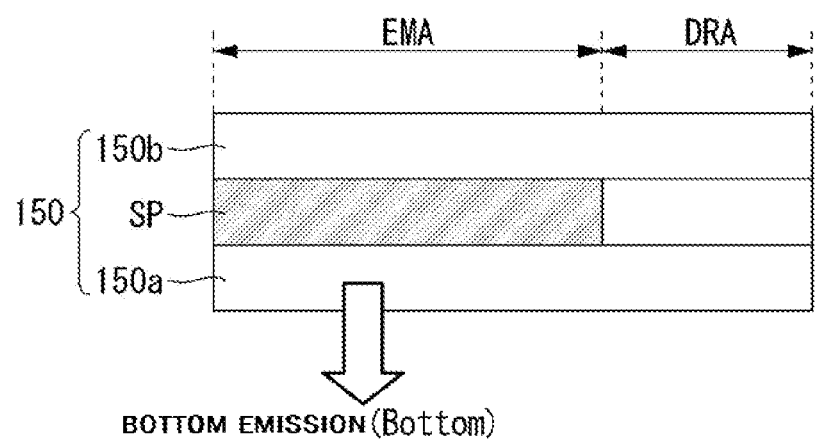

FIGS. 4 and 5 are cross-sectional views for explaining a function of a display panel according to the first embodiment of the present disclosure, FIG. 6 is a diagram for explaining an emissive area and a circuit area defined in a sub-pixel, and FIG. 7 is a diagram for explaining a light shield layer of a driving transistor shown in FIG. 6 according to the first embodiment of the present disclosure.

As shown in FIGS. 4 and 5, the display panel 150 may include the sub-pixel SP positioned between the lower substrate 150a and the upper substrate 150b. The sub-pixel SP may be embodied based on the circuit described with reference to FIG. 3.

The lower substrate 150a and the upper substrate 150b may be selected as a same material or different materials. For example, the lower substrate 150a may be selected as a single material such as resin having flexibility or glass having rigidity, and the upper substrate 150b may be selected as a composite material such as organic/inorganic material, but the present disclosure is not limited thereto.

The sub-pixel SP may have an emissive area EMA for emitting light generated from an organic light emitting diode and a circuit area DRA on which a circuit for driving an organic light emitting diode is positioned. Depending on a configuration of the sub-pixel SP, the display panel 150 may emit light in a direction toward the upper substrate 150b (FIG. 4) or may emit light in a direction toward the lower substrate 150a (FIG. 5).

However, this is merely an example, and may be combined with functions of FIGS. 4 and 5. That is, the display panel 150 may also emit light in directions toward the lower substrate 150a and the upper substrate 150b (double-surface display).

Figure 6A:
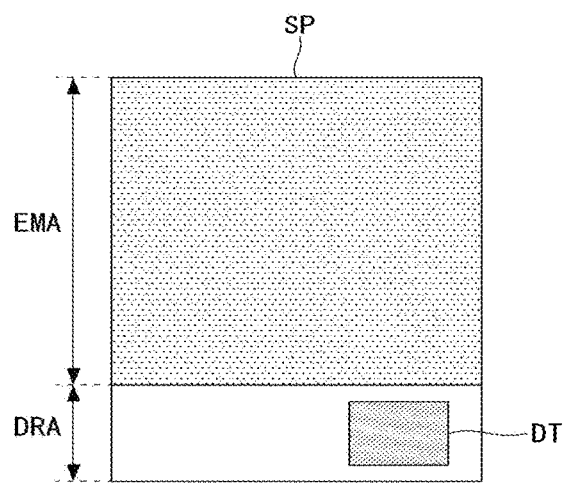
FIGS. 6A and 6B are diagrams for explaining an emissive area and a circuit area defined in a sub-pixel according to the first embodiment of the present disclosure.

As shown in FIG. 6A, viewed from the above, the emissive area EMA and the circuit area DRA of the sub-pixel SP may be defined to be separated. The structure shown in FIG. 6A may be applied to a bottom emission type display panel that emits light in a direction toward the lower substrate 150a as shown in FIG. 5.

Figure 6B:
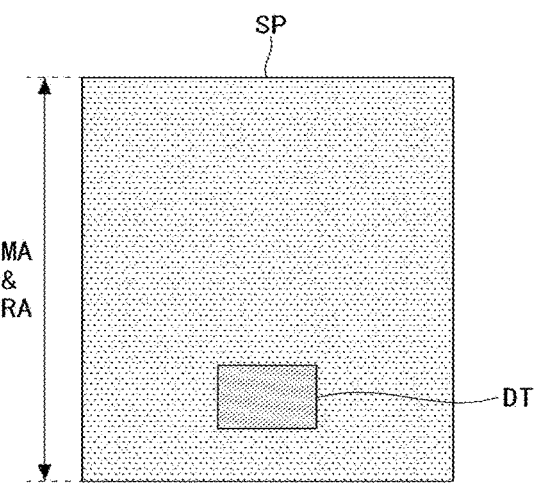

As shown in FIG. 6B, viewed from the above, the emissive area EMA and the circuit area DRA of the sub-pixel SP may be defined to be mixed. The structure shown in FIG. 6B may be applied to a top emission type display panel emits light in a direction toward the upper substrate 150b as shown in FIG. 4.

As shown in FIGS. 6 and 7, according to the first embodiment of the present disclosure, the driving transistor DT may be protected by a light shield layer BLS & TLS. The light shield layer BLS & TLS may be selected as a metallic material that is capable of shielding or absorbing light. The light shield layer BLS & TLS may include a lower-surface light shield layer BLS and an upper-surface light shield layer TLS that are separately positioned at a lower layer and an upper layer of the driving transistor DT. In order to protect the driving transistor DT from external light (shield external light), the light shield layer BLS & TLS may cover a lower surface, an upper surface, and a side surface of a semiconductor layer ACT of the driving transistor DT.

Viewed from the above in FIG. 7A, the lower-surface light shield layer BLS and the upper-surface light shield layer TLS may be arranged to occupy a wider area than the driving transistor DT. Viewed based on a sectional view of FIG. 7B, the lower-surface light shield layer BLS and the upper-surface light shield layer TLS may have the same area.

Hereinafter, the driving transistor DT and the light shield layer BLS & TLS positioned therearound that are positioned on the lower substrate 150a will be described. However, in the following description, a top gate type in which a gate electrode GAT of the driving transistor DT is positioned on the semiconductor layer ACT will be exemplified, but the present disclosure is not limited thereto.

The lower-surface light shield layer BLS may be positioned on one surface of the lower substrate 150a. Although an example in which the lower-surface light shield layer BLS has a square shape is illustrated, this may be changed depending on a shape of the semiconductor layer ACT of the driving transistor DT, or the like. A buffer layer BUF may be positioned on the lower-surface light shield layer BLS. The semiconductor layer ACT may be positioned on the buffer layer BUF. A gate insulator layer GI may be positioned in the form of an island on the semiconductor layer ACT. The gate electrode GAT may be positioned in the form of an island on the gate insulator layer GI.

An interlayer insulator layer ILD may be positioned on the buffer layer BUF and may cover the gate electrode GAT or the like. A source electrode SDA and a drain electrode SDB may be positioned on the interlayer insulator layer ILD and may contact a source region and a drain region of the semiconductor layer ACT through a contact hole of the interlayer insulator layer ILD. A passivation layer PAS may be positioned on the interlayer insulator layer ILD and may cover the source electrode SDA, the drain electrode SDB, and the like. The upper-surface light shield layer TLS may be positioned on the passivation layer PAS and may contact the lower-surface light shield layer BLS through a contact hole that penetrates the passivation layer PAS, the interlayer insulator layer ILD, and the buffer layer BUF.

Although an example in which the upper-surface light shield layer TLS has a square shape is illustrated, this may be changed depending on a structure of the driving transistor DT or a pattern shape of the source electrode SDA and the drain electrode SDB. The upper-surface light shield layer TLS may include side-surface shield layers TLS1 and TLS2 that surround four surfaces of the driving transistor DT (or all side surfaces of a semiconductor layer; because the semiconductor layer is not shaped like a square), and an upper-surface shield layer TLS3 that covers an upper surface of the driving transistor DT. Although only the two side-surface shield layers TLS1 and TLS2 are illustrated due to the characteristics of a sectional view, the four surfaces of the driving transistor DT need to be surrounded, at least two side-surface shield layers may be further present, needless to say. However, a side surface may be partially open in order to connect the driving transistor DT to other devices such as the switching transistor SW, the sensing transistor SE, the storage capacitor CST, and the organic light emitting diode OLED. For example, a partial side surface on which a relatively large amount of external light is incident may be shielded by a side-surface shield layer, and the remaining side surface on which a relatively small amount of external light is incident may be open for connection with other devices (A region for positioning at least one of the source electrode SDA or the drain electrode SDB connected to the semiconductor layer ACT therethrough rather than contacting the side-surface shield layer may be defined as an opening region.). In another example, all side surfaces may be shielded by the side-surface shield layer and only a connection portion with other devices may be locally open.

According to the first embodiment of the present disclosure, the display panel includes the light shield layer BLS & TLS that surrounds at least one side surface as well as the lower and upper surfaces of the driving transistor DT, and thus, a problem such as current leakage of the semiconductor layer ACT or threshold voltage shift (Vth shift) due to influence of external light may be overcome.

Figure 9:
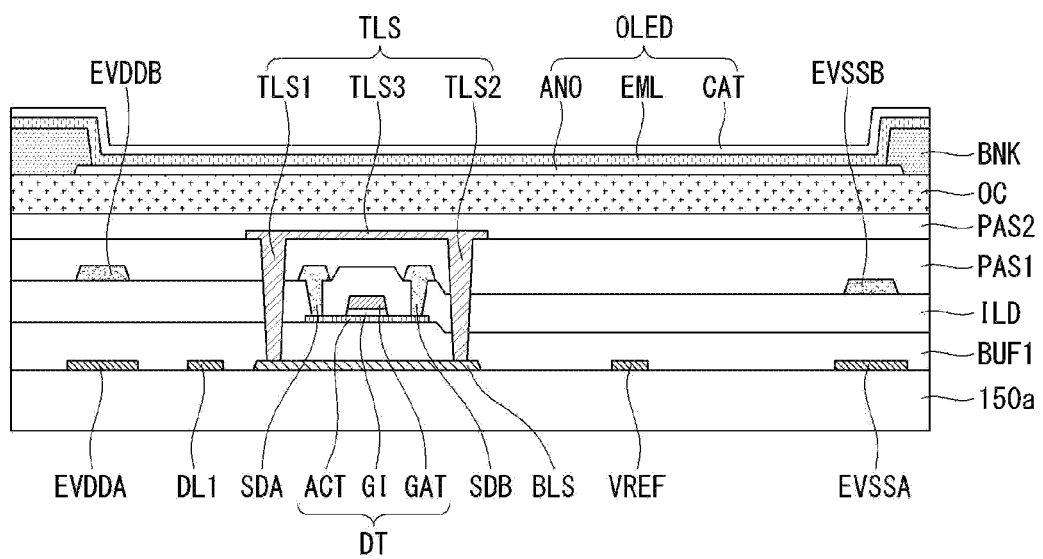
FIG. 9 is a diagram showing a second example of the sub-pixel according to the second embodiment of the present disclosure.

FIG. 8 is a diagram showing a first example of a sub-pixel according to a second embodiment of the present disclosure, and FIG. 9 is a diagram showing a second example of the sub-pixel according to the second embodiment of the present disclosure.

As shown in FIG. 8, according to the first example of the second embodiment of the present disclosure, the sub-pixel may include the light shield layer BLS & TLS described in the first embodiment. The second embodiment is different from the first embodiment in terms of the configuration and structure of a surrounding portion of the driving transistor DT, and thus, will be described in terms of the difference.

The data line DL1, a lower first voltage line EVDDA, the reference line VREF, and a lower second voltage line EVSSA that are formed of the same material as the lower-surface light shield layer BLS as well as the lower-surface light shield layer BLS may be positioned on the lower substrate 150a.

The light shield layer BLS, the data line DL1, the lower first voltage line EVDDA, the reference line VREF, and the lower second voltage line EVSSA may be positioned between the lower substrate 150a and the buffer layer BUF, and may be spaced apart from one another.

An upper first voltage line EVDDB and an upper second voltage line EVSSB may be positioned on the interlayer insulator layer ILD. The upper first voltage line EVDDB and the upper second voltage line EVSSB may be formed of the same material as the source/drain electrodes SDA and SDB. The upper first voltage line EVDDB and the upper second voltage line EVSSB may be positioned at different layer levels from the lower first voltage line EVDDA and the lower second voltage line EVSSA, but may be electrically connected thereto. That is, the first voltage line and the second voltage line may include an auxiliary voltage line.

An overcoat layer OC (an insulating layer or a planarization layer) may be positioned on the passivation layer PAS. The upper-surface light shield layer TLS may be positioned on the passivation layer PAS, and thus, may be protected by the overcoat layer OC. In detail, the overcoat layer OC may cover the upper-surface shield layer TLS3 of the upper-surface light shield layer TLS.

A lower electrode ANO may be positioned on the overcoat layer OC. The lower electrode ANO may be selected as an anode and may be connected to the source electrode SDA or the drain electrode SDB of the driving transistor DT. A bank layer BNK may be positioned on the overcoat layer OC. The bank layer BNK may partially cover the lower electrode ANO and may partially expose the lower electrode ANO.

An emissive layer EML may be positioned on the lower electrode ANO. The emissive layer EML may emit red, green, and blue light, but the present disclosure is not limited thereto. An upper electrode CAT may be positioned on the emissive layer EML. The upper electrode CAT may be selected as a cathode and may be connected to a second voltage line in a non-display area in which sub-pixels are not formed. The lower electrode ANO, the emissive layer EML, and the upper electrode CAT may be included in the organic light emitting diode OLED.

As shown in FIG. 9, the sub-pixel according to the second example of the second embodiment of the present disclosure is almost the same as the first example of the second embodiment. However, the second example of the second embodiment of the present disclosure is different from the first example of the second embodiment in that the passivation layer includes a first passivation layer PAS1 on the interlayer insulator layer ILD and a second passivation layer PAS2 on the upper-surface light shield layer TLS. That is, according to the second example of the second embodiment, the passivation layer includes two layers, and thus, the second example of the second embodiment is different from the first example of the second embodiment only in that the upper-surface shield layer TLS3 of the upper-surface light shield layer TLS is protected by the second passivation layer PAS2.

According to the second embodiment of the present disclosure, the display panel may have the light shield layer BLS & TLS that surrounds at least one side surface as well as the lower and upper surfaces of the driving transistor DT, and thus, a problem such as current leakage of the semiconductor layer ACT or threshold voltage shift (Vth shift) due to influence of external light may be overcome.

Figure 10:
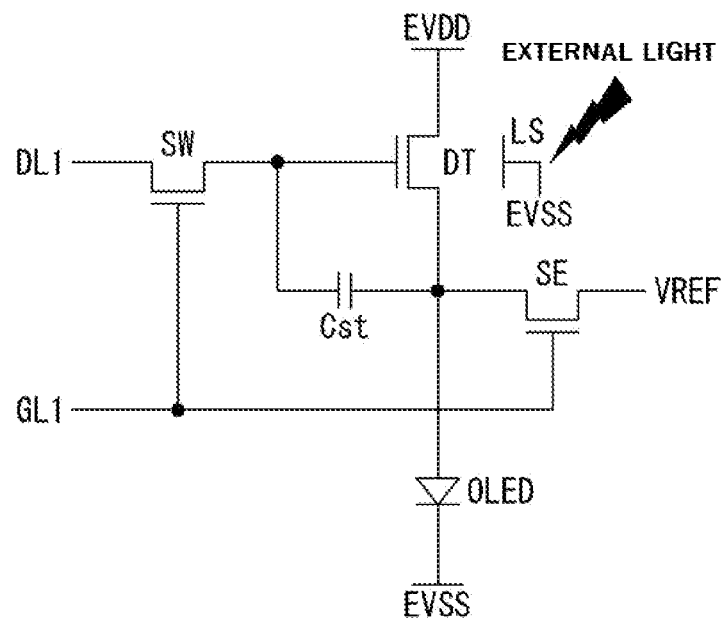
FIG. 10 is a diagram showing an example of a detailed circuit configuration of a sub-pixel according to a third embodiment of the present disclosure.
Figure 11:
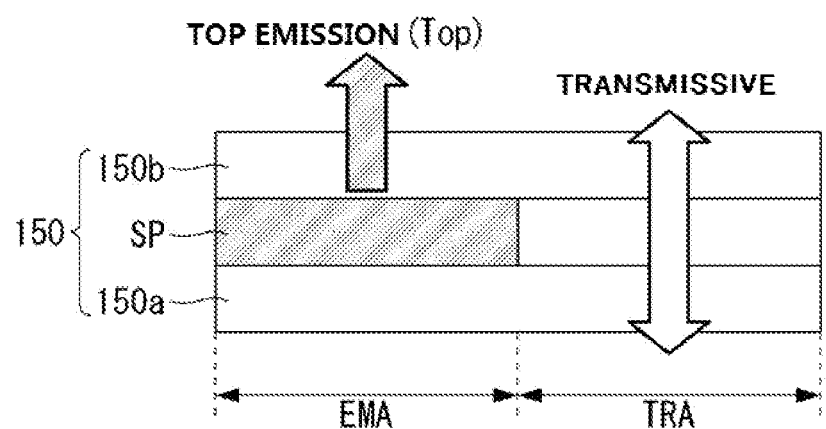
FIGS. 11 and 12 are cross-sectional views for explaining a function of a display panel according to the third embodiment of the present disclosure.
Figure 12:
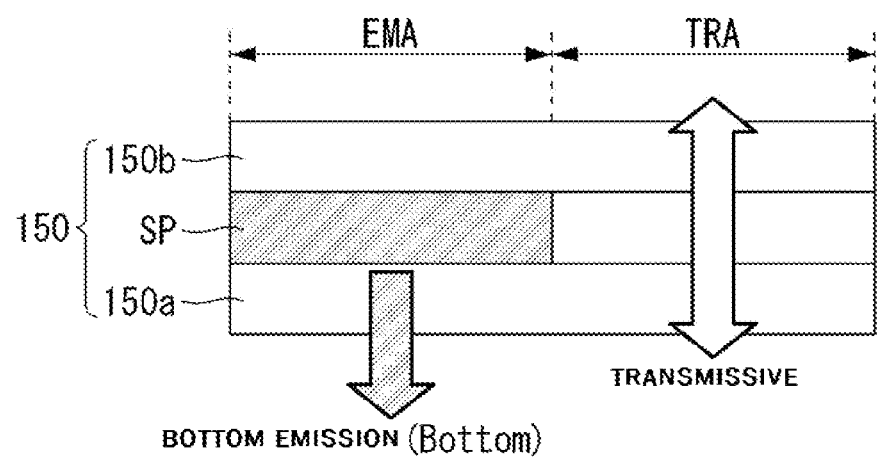

FIG. 10 is a diagram showing an example of a detailed circuit configuration of a sub-pixel according to a third embodiment of the present disclosure, FIGS. 11 and 12 are cross-sectional views for explaining a function of a display panel according to the third embodiment of the present disclosure, FIG. 13 is a diagram for explaining an emissive area and a transparent area defined in a sub-pixel, and FIG. 14 is a diagram for explaining a configuration of a light shield layer of a driving transistor shown in FIG. 13 according to the third embodiment of the present disclosure.

As shown in FIG. 10, one sub-pixel SP according to the third embodiment of the present disclosure may include the switching transistor SW, the driving transistor DT, the sensing transistor SE, the storage capacitor CST, and the organic light emitting diode OLED. One sub-pixel SP according to the third embodiment is similar to the first embodiment, but is different from the first embodiment in that the light shield layer LS included in the driving transistor DT is connected to the second voltage line EVSS.

As shown in FIGS. 11 and 12, the display panel 150 according to the third embodiment of the present disclosure may include the sub-pixel SP positioned between the lower substrate 150a and the upper substrate 150b. The sub-pixel SP may be embodied based on the circuit described with reference to FIG. 10.

The display panel 150 according to the third embodiment of the present disclosure is similar to the first embodiment, but is different from the first embodiment in that the sub-pixel SP has the emissive area EMA that emits light generated from the organic light emitting diode and a transparent area TRA that transmits light therethrough. That is, the sub-pixel may be configured to embody a transparent display device.

Figure 13A:
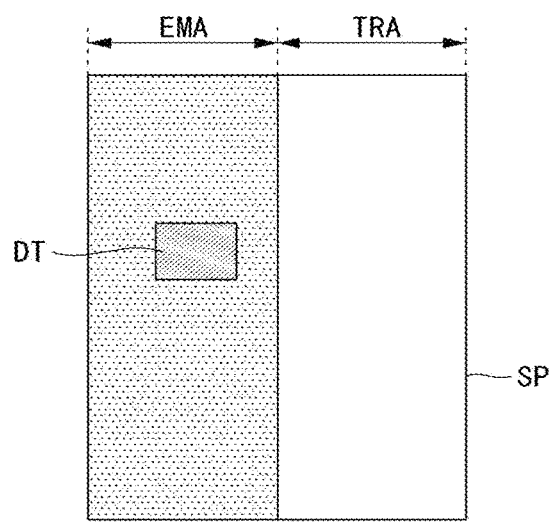
FIGS. 13A and 13B are diagrams for explaining an emissive area and a transparent area defined in a sub-pixel according to the third embodiment of the present disclosure.
Figure 13B:
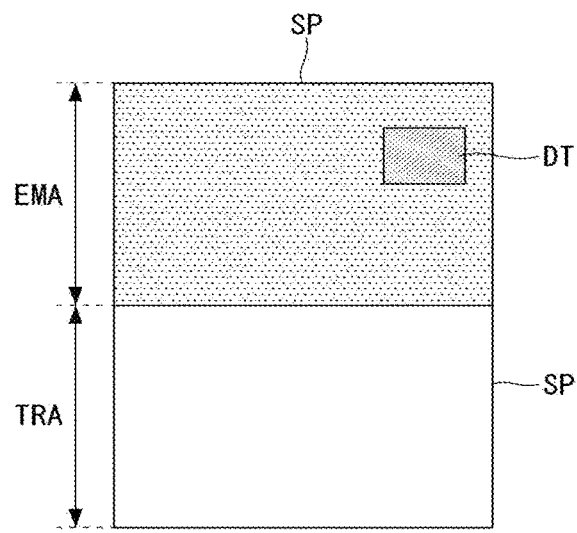

As shown in FIGS. 13A and 13B, viewed from the above, the emissive area EMA and the transparent area TRA of the sub-pixel SP may be defined to be separated from each other. FIG. 13A illustrates a structure in which the emissive area EMA and the transparent area TRA are separated in right and lefts directions of the sub-pixel SP, and FIG. 13B illustrates a structure in which the emissive area EMA and the transparent area TRA are separated in up and down directions of the sub-pixel SP.

FIG. 13 illustrates an example in which a circuit such as the driving transistor DT is positioned in the emissive area EMA, and corresponds to a top emission type display panel in which light is emitted in a direction toward the upper substrate 150b.

As shown in FIGS. 13 and 14, according to the third embodiment of the present disclosure, the driving transistor DT may be protected by the light shield layer BLS & TLS. The light shield layer BLS & TLS may be selected as a metallic material that is capable of shielding or absorbing light. The light shield layer BLS & TLS may include the lower-surface light shield layer BLS and the upper-surface light shield layer TLS that are separately positioned at a lower layer and an upper layer of the driving transistor DT.

Figure 14A:
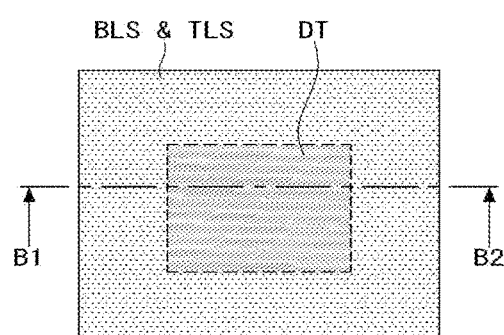
FIGS. 14A and 14B are diagrams for explaining a configuration of a light shield layer of a driving transistor shown in FIG. 13 according to the third embodiment of the present disclosure.
Figure 14B:
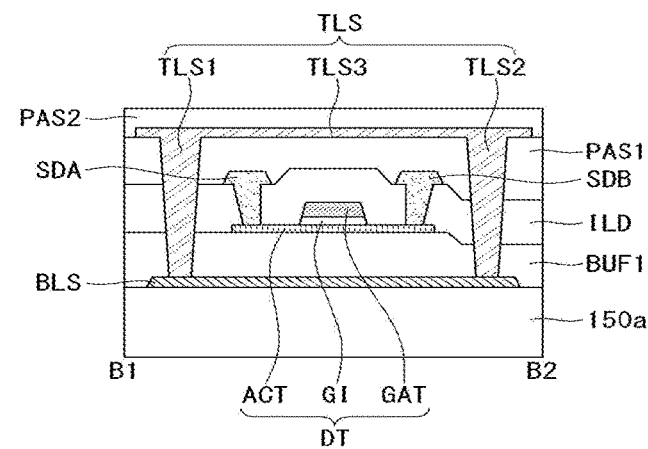

Viewed from the above in FIG. 14A, the lower-surface light shield layer BLS and the upper-surface light shield layer TLS may be arranged to occupy a wider area than the driving transistor DT. Viewed based on a sectional view of FIG. 14B, the lower-surface light shield layer BLS and the upper-surface light shield layer TLS may have the same area.

Hereinafter, the light shield layer BLS & TLS according to the third embodiment is the same as the aforementioned first embodiment in that being electrically connected to the second voltage line, and thus, is understood with reference to the first embodiment.

According to the third embodiment of the present disclosure, the display panel includes the light shield layer BLS & TLS that surrounds at least one side surface as well as the lower and upper surfaces of the driving transistor DT, and thus, a problem such as current leakage of the semiconductor layer ACT or threshold voltage shift (Vth shift) due to influence of external light may be overcome. The light shield layer BLS & TLS may be connected to the second voltage line, and thus, may be maintained in an electrically stable state.

Figure 15:
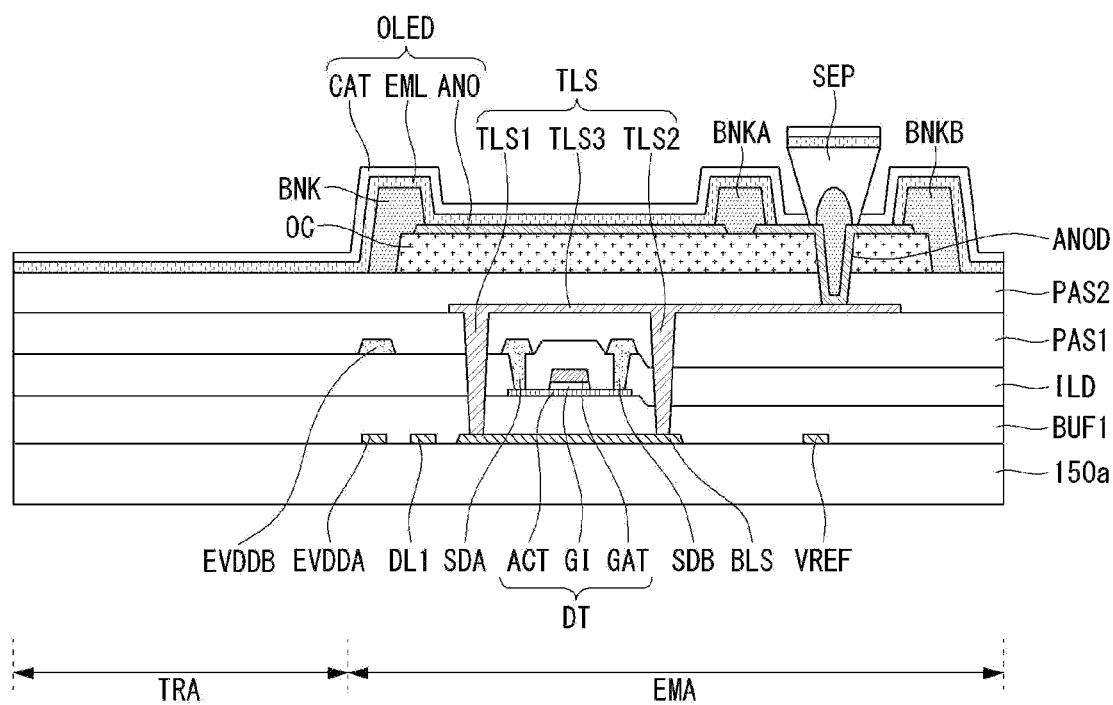
FIG. 15 is a diagram showing an example of a sub-pixel according to a fourth embodiment of the present disclosure.
Figure 16:
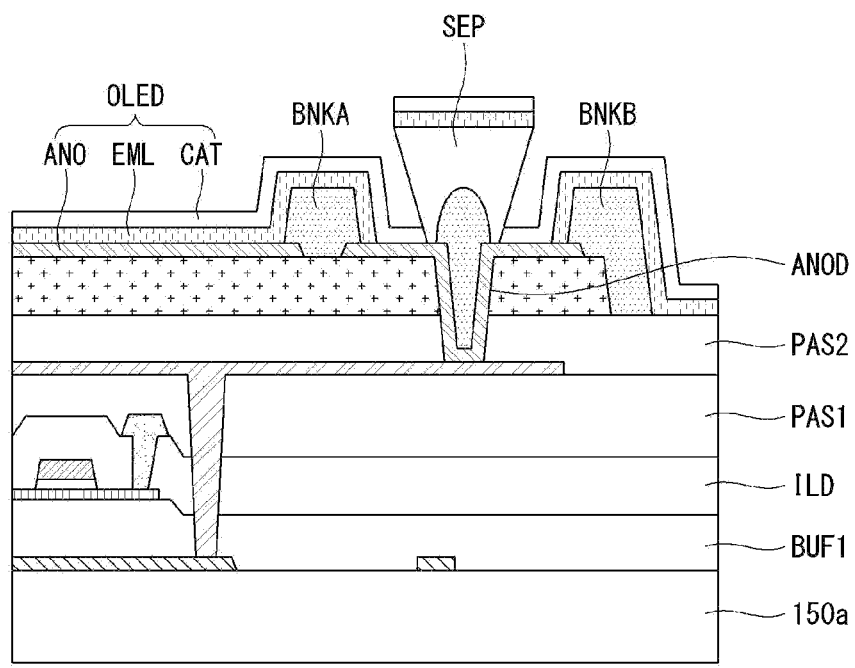
FIG. 16 is a detailed diagram showing a portion of FIG. 15 according to the fourth embodiment of the present disclosure.

FIG. 15 is a diagram showing an example of a sub-pixel according to a fourth embodiment of the present disclosure, and FIG. 16 is a detailed diagram showing a portion of FIG. 15.

As shown in FIGS. 15 and 16, according to the fourth embodiment of the present disclosure, the sub-pixel may include the light shield layer BLS & TLS described in the third embodiment. The fourth embodiment is different from the third embodiment in terms of the configuration and structure of a surrounding portion of the driving transistor DT, and thus, will be described in terms of the difference.

The data line DL1, the lower first voltage line EVDDA, and the reference line VREF that are formed of the same material as the lower-surface light shield layer BLS as well as the lower-surface light shield layer BLS may be positioned on the lower substrate 150a.

The light shield layer BLS, the data line DL1, the lower first voltage line EVDDA, and the reference line VREF may be positioned between the lower substrate 150a and the buffer layer BUF, and may be spaced apart from one another.

The upper first voltage line EVDDB may be positioned on the interlayer insulator layer ILD. The upper first voltage line EVDDB may be formed of the same material as the source/drain electrodes SDA and SDB. The upper first voltage line EVDDB and the lower first voltage line EVDDA may be positioned at different layer levels, but may be electrically connected thereto. That is, the first voltage line may include an auxiliary voltage line.

The upper-surface light shield layer TLS may be positioned between the first passivation layer PAS1 and the second passivation layer PAS2. The upper-surface shield layer TLS3 of the upper-surface light shield layer TLS may extend to a region in which a partition SEP is positioned. That is, the lower-surface light shield layer BLS and the upper-surface light shield layer TLS may have different sizes. The upper-surface shield layer TLS3 of the upper-surface light shield layer TLS extends to the region in which the partition SEP is positioned, for the following reason.

The overcoat layer OC (or a planarization layer) may be positioned on the second passivation layer PAS2. The overcoat layer OC may be positioned only in the emissive area EMA and may not be positioned in the transparent area TRA. The upper-surface light shield layer TLS may be positioned on the first passivation layer PAS1 and may be protected by the second passivation layer PAS2 and the overcoat layer OC. In detail, the second passivation layer PAS2 and the overcoat layer OC may cover the upper-surface shield layer TLS3 of the upper-surface light shield layer TLS, but may have a contact hole through which a portion of the upper-surface shield layer TLS3 is exposed.

The lower electrode ANO and a dummy lower electrode ANOD may be positioned on the overcoat layer OC. The lower electrode ANO may be selected as an anode, and may be connected to the source electrode SDA or the drain electrode SDB of the driving transistor DT.

The dummy lower electrode ANOD may be formed of the same material as the lower electrode ANO, but may be electrically separated from each other. The dummy lower electrode ANOD may be electrically connected to the upper-surface shield layer TLS3 of the upper-surface light shield layer TLS through the contact hole of the second passivation layer PAS2 and the overcoat layer OC.

A bank layer BNK, BNKA, and BNKB may be positioned on the overcoat layer OC. The bank layer BNK, BNKA, and BNKB may partially cover the lower electrode ANO and the dummy lower electrode ANOD and may partially expose the lower electrode ANO and the dummy lower electrode ANOD. The bank layer BNK, BNKA, and BNKB may include a one-side bank layer BNKA and the other-side bank layer BNKB. The one-side bank layer BNKA and the other-side bank layer BNKB may be a positive taper shape like the bank layer BNK adjacent to the transparent area TRA.

However, the one-side bank layer BNKA and the other-side bank layer BNKB that are not adjacent to the transparent area TRA may expose a surrounding portion of the contact hole of the overcoat layer OC. The partition SEP may be formed on a protrusion including the remaining bank layer between the one-side bank layer BNKA and the other-side bank layer BNKB.

The partition SEP may be a reverse taper shape. The partition SEP may be positioned on a boundary between sub-pixels in order to prevent current leakage between adjacent emissive layers. That is, the partition SEP may be disposed to identify a boundary for each pixel with the bank layer BNK, BNKA, and BNKB.

The emissive layer EML may be positioned on the lower electrode ANO. The emissive layer EML may emit red, green, and blue light, but the present disclosure is not limited thereto. The upper electrode CAT may be positioned on the emissive layer EML. The upper electrode CAT may be selected as a cathode and may be connected to the second voltage line in a display region in which sub-pixels are formed. The lower electrode ANO, the emissive layer EML, and the upper electrode CAT may be included in the organic light emitting diode OLED.

As seen from an enlarged view of FIG. 16, the emissive layer EML may partially expose the dummy lower electrode ANOD in an internal space of the one-side bank layer BNKA and the other-side bank layer BNKB by the reversely tapered partition SEP. As a result, the upper electrode CAT may contact the dummy lower electrode ANOD in the internal space of the one-side bank layer BNKA and the other-side bank layer BNKB and may be electrically connected to the upper-surface shield layer TLS3 of the upper-surface light shield layer TLS.

As described above, the light shield layer BLS & TLS may be electrically connected to the second voltage line. Thus, according to the fourth embodiment, the upper electrode CAT and the second voltage line may be electrically connected to each other without a separate auxiliary voltage line (e.g., EVSSB of FIG. 9). That is, the dummy lower electrode ANOD and the upper-surface shield layer TLS3 of the upper-surface light shield layer TLS may be an auxiliary voltage line that functions as the upper second voltage line according to the second embodiment.

According to the fourth embodiment, an example in which the first passivation layer PAS1 and the second passivation layer PAS2 is present, and the upper-surface shield layer TLS3 of the upper-surface light shield layer TLS is positioned therebetween is illustrated and described. However, as seen from the above embodiment, the upper-surface shield layer TLS3 of the upper-surface light shield layer TLS may be positioned on one passivation layer or may also cover the overcoat layer OC.

According to the fourth embodiment of the present disclosure, the display panel includes the light shield layer BLS & TLS that surrounds at least one side surface as well as the lower and upper surfaces of the driving transistor DT, and thus, a problem such as current leakage of the semiconductor layer ACT or threshold voltage shift (Vth shift) due to influence of external light may be overcome. The light shield layer BLS & TLS may be connected to the second voltage line, and thus, may be maintained in an electrically stable state. In addition, the dummy lower electrode ANOD and the light shield layer BLS & TLS may configure an auxiliary voltage line of the second voltage line, and thus, a problem in terms of IR drop or voltage drop may be overcome and uniform brightness may also be achieved based thereon.

Figure 17:
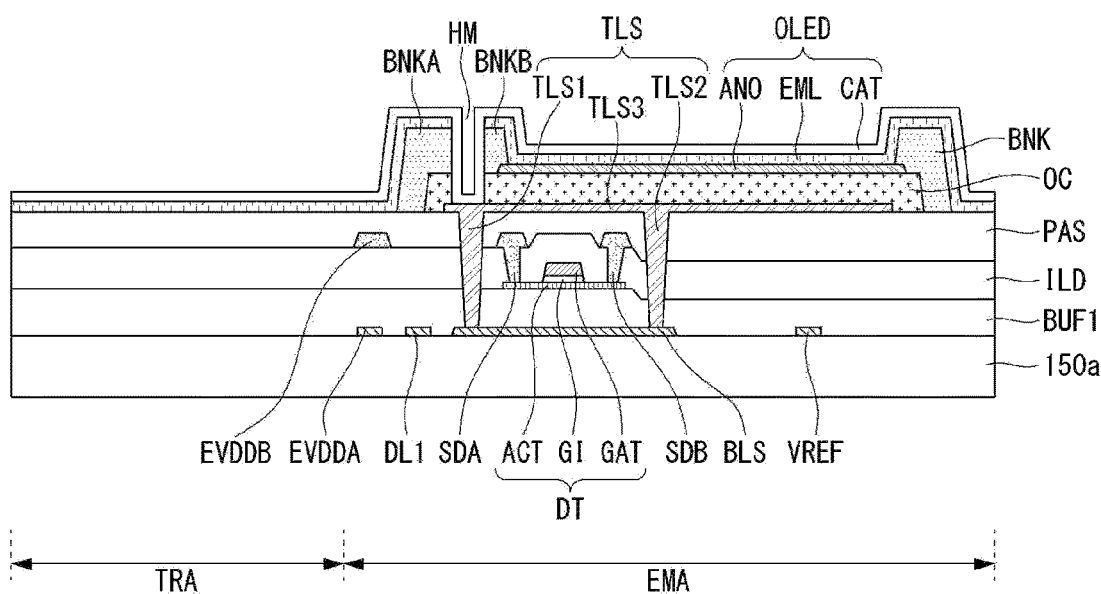
FIG. 17 is a diagram showing an example of a sub-pixel according to a fifth embodiment of the present disclosure.
Figure 17:
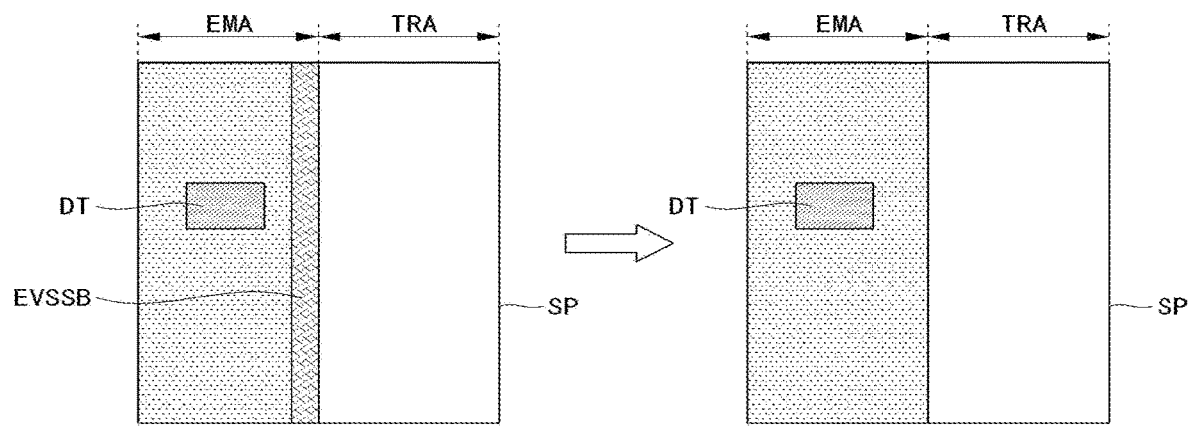

FIG. 17 is a diagram showing an example of a sub-pixel according to a fifth embodiment of the present disclosure.

As shown in FIG. 17, according to the fifth embodiment of the present disclosure, the sub-pixel may include the light shield layer BLS & TLS described in the third embodiment. The fifth embodiment is different from the third embodiment in terms of the configuration and structure of a surrounding portion of the driving transistor DT, and thus, will be described in terms of the difference.

The upper-surface shield layer TLS3 of the upper-surface light shield layer TLS may be positioned on the passivation layer PAS and may also cover the overcoat layer OC. The overcoat layer OC may be positioned only in the emissive area EMA. The lower electrode ANO may be positioned on the overcoat layer OC. The bank layer BNK, BNKA, and BNKB may be positioned on a boundary of the passivation layer PAS and the overcoat layer OC.

The bank layer BNK, BNKA, and BNKB may partially expose the lower electrode ANO. The bank layer BNK, BNKA, and BNKB may be a positive taper shape. The bank layer BNK, BNKA, and BNKB may include the one-side bank layer BNKA and the other-side bank layer BNKB that are adjacent to the boundary of the transparent area TRA and the emissive area EMA and are separated from each other to expose the upper-surface shield layer TLS3 of the upper-surface light shield layer TLS.

The one-side bank layer BNKA and the other-side bank layer BNKB may be defined based on a hole HM through which the upper-surface shield layer TLS3 of the upper-surface light shield layer TLS is exposed and may not be physically and completely separated. The hole HM of the one-side bank layer BNKA and the other-side bank layer BNKB may be satisfied as long as the hole HM penetrates the overcoat layer OC and exposes the upper-surface shield layer TLS3 of the upper-surface light shield layer TLS.

The hole HM may be finely formed through laser patterning prior to an operation of forming the emissive layer EML. In this case, the emissive layer EML has low step coverage, and thus, is not capable of being deposited inside the fine hole HM. However, the upper electrode CAT has high step coverage, and thus, is capable of being formed in the fine hole HM. However, the present disclosure is not limited thereto, and the hole HM may be formed between the operation of forming the emissive layer EML and an operation of forming the upper electrode CAT.

The emissive layer EML may be positioned on the lower electrode ANO. The emissive layer EML may emit red, green, and blue light, but the present disclosure is not limited thereto. The upper electrode CAT may be positioned on the emissive layer EML. The upper electrode CAT may be selected as a cathode, may be deposited along the hole HM provided by the one-side bank layer BNKA and the other-side bank layer BNKB, and may be connected to the second voltage line in a display region to contact the upper-surface shield layer TLS3 of the upper-surface light shield layer TLS. The lower electrode ANO, the emissive layer EML, and the upper electrode CAT may be included in the organic light emitting diode OLED.

According to the fifth embodiment, an example in which, as one passivation layer PAS is present, the overcoat layer OC covers the upper-surface shield layer TLS3 of the upper-surface light shield layer TLS is illustrated and described. However, as seen from the above embodiment, the upper-surface shield layer TLS3 of the upper-surface light shield layer TLS may be positioned between two passivation layers.

According to the fifth embodiment of the present disclosure, the display panel includes the light shield layer BLS & TLS that surrounds at least one side surface as well as the lower and upper surfaces of the driving transistor DT, and thus, a problem such as current leakage of the semiconductor layer ACT or threshold voltage shift (Vth shift) due to influence of external light may be overcome. The light shield layer BLS & TLS may be connected to the second voltage line, and thus, may be maintained in an electrically stable state. In addition, the dummy lower electrode ANOD and the light shield layer BLS & TLS may configure an auxiliary voltage line of the second voltage line, and thus, a problem in terms of IR drop or voltage drop may be overcome and uniform brightness may also be achieved based thereon.

FIG. 18 is a diagram for explaining advantages according to the fourth or fifth embodiment of the present disclosure.

As shown in FIG. 18A, when the sub-pixel SP according to the second or third embodiment is embodied, 'EVSSB' corresponding to an auxiliary voltage line of the second voltage line needs to be disposed between the emissive area EMA and the transparent area TRA. However, as shown in FIG. 18B, when the sub-pixel SP according to the fourth or fifth embodiment is embodied, 'EVSSB' corresponding to the auxiliary voltage line of the second voltage line may be removed (omitted). This is because the light shield layer connected to the second voltage line and the upper electrode are electrically connected to each other.

Accordingly, when a transparent display device is embodied based on the structure according to the fourth or fifth embodiment, it is not required to separately form the auxiliary voltage line of the second voltage line, and thus, advantages in terms of a process and an aperture ratio may also be advantageously enhanced.

According to the present disclosure, a problem such as current leakage of the semiconductor layer ACT or threshold voltage shift may be overcome based on a light shield layer that surrounds at least one side surface as well as the lower and upper surfaces of the driving transistor. According to the present disclosure, the light shield layer and the second voltage line may be connected to each other, and thus, an electrically stable state may be maintained, thereby enhancing driving stability and reliability. In addition, according to the present disclosure, the light shield layer may configure an auxiliary voltage line of the second voltage line, and thus, a problem in terms of IR drop or voltage drop may be overcome and uniform brightness may also be achieved based thereon.

What is claimed is:

1. A light emitting display device comprising:
a lower substrate;
a transistor positioned on the lower substrate, the transistor including a semiconductor layer, a gate electrode, a source electrode, and a drain electrode;
a light shield layer covering a lower surface, an upper surface, and a side surface of the semiconductor layer;
an insulator layer covering the upper-surface light shield layer;
an organic light emitting diode on the insulating layer, the organic light emitting diode including a lower electrode, an emissive layer, and an upper electrode which are sequentially stacked,
a dummy lower electrode connected to the upper-surface light shield layer spaced apart from the lower electrode at a same layer level as the lower electrode; and
a bank layer positioned on the insulator layer and covering a portion of the lower electrode;
wherein the light shield layer is electrically connected to the upper electrode,
wherein the light shield layer includes a lower-surface light shield layer positioned below the semiconductor layer, a side-surface light shield layer positioned on at least one side surface of the semiconductor layer, and an upper-surface light shield layer positioned on the semiconductor layer,
wherein the side-surface light shield layer and the upper-surface light shield layer are in physical contact with each other,
wherein the upper-surface light shield layer entirely covers the upper surface of the semiconductor layer,
wherein the upper electrode is electrically connected to the voltage line through the dummy lower electrode and the upper-surface light shield layer,
wherein the insulator layer includes a contact hole through which the upper-surface light shield layer positioned below the insulator layer is exposed,
wherein the bank layer includes a one-side bank layer and another-side bank layer that are separated from each other to expose a surrounding portion of the contact hole,
wherein a partition is positioned between the one-side bank layer and the other-side bank layer, and
wherein the upper electrode and the dummy lower electrode are electrically connected to each other in an internal space of the one-side bank layer and the other-side bank layer.

2. The light emitting display device of claim 1, wherein the lower-surface light shield layer and the upper-surface light shield layer have a same size.

3. The light emitting display device of claim 1, wherein the light shield layer is electrically connected to a voltage line that is positioned on the lower substrate and transfers a low-potential voltage.

4. The light emitting display device of claim 1, wherein the bank layer, the one-side bank layer, and the other-side bank layer have a positive taper shape; and
wherein the partition has a reverse taper shape.

5. A light emitting display device comprising:
a substrate;
a transistor on the substrate, the transistor including a semiconductor layer;
a light shield layer including a lower light shield layer below the semiconductor layer, a side light shield layer on at least one side surface of the semiconductor layer, and an upper light shield layer on the semiconductor layer;
an insulator layer covering the upper light shield layer;
a lower electrode on the insulator layer;
a bank layer on the insulator layer and covering a portion of the lower electrode;
a dummy lower electrode spaced apart from the lower electrode at a same layer level as the lower electrode,
an emissive layer on the lower electrode; and
an upper electrode on the emissive layer,
wherein the dummy lower electrode is connected to the upper light shield layer,
wherein the side light shield layer and the upper light shield layer are in physical contact with each other,
wherein the upper light shield layer entirely covers the semiconductor layer,
wherein the upper light shield layer is electrically connected to the upper electrode via the dummy lower electrode,
wherein the insulator layer includes a contact hole through which the upper light shield layer below the insulator layer is exposed,
wherein the bank layer includes a one-side bank layer and another-side bank layer that are separated from each other to expose a surrounding portion of the contact hole,
wherein a partition is between the one-side bank layer and the other-side bank layer, and
wherein the upper electrode and the dummy lower electrode are electrically connected to each other in an internal space of the one-side bank layer and the other-side bank layer.

6. The light emitting display device of claim 5, wherein the bank layer, the one-side bank layer, and the other-side bank layer have a positive taper shape; and
wherein the partition has a reverse taper shape.

* * * * *